US011926920B2

United States Patent
Jia et al.

(10) Patent No.: US 11,926,920 B2
(45) Date of Patent: Mar. 12, 2024

(54) ELECTROPLATING APPARATUS AND ELECTROPLATING METHOD

(71) Applicant: ACM Research (Shanghai) Inc., Shanghai (CN)

(72) Inventors: Zhaowei Jia, Shanghai (CN); Jian Wang, Shanghai (CN); Hui Wang, Shanghai (CN); Hongchao Yang, Shanghai (CN)

(73) Assignee: ACM RESEARCH (SHANGHAI), INC., Shanghai (CN)

( * ) Notice: Subject to any disclaimer, the term of this patent is extended or adjusted under 35 U.S.C. 154(b) by 0 days.

(21) Appl. No.: 17/057,981

(22) PCT Filed: Apr. 29, 2019

(86) PCT No.: PCT/CN2019/084880
§ 371 (c)(1),
(2) Date: Nov. 23, 2020

(87) PCT Pub. No.: WO2019/223499
PCT Pub. Date: Nov. 28, 2019

(65) Prior Publication Data
US 2021/0301416 A1 Sep. 30, 2021

(30) Foreign Application Priority Data
May 21, 2018 (CN) .......................... 201810487847.5

(51) Int. Cl.
*C25D 5/18* (2006.01)
*C25D 7/12* (2006.01)
(Continued)

(52) U.S. Cl.
CPC ................ *C25D 5/18* (2013.01); *C25D 7/12* (2013.01); *C25D 17/001* (2013.01); *C25D 17/06* (2013.01);
(Continued)

(58) Field of Classification Search
CPC .......... C25D 17/12–123; C25D 17/001; H01L 21/2885; H01L 21/76873
See application file for complete search history.

(56) References Cited

U.S. PATENT DOCUMENTS

| 5,382,803 A | 1/1995 | Asakawa |
| 2005/0067290 A1 | 3/2005 | Bonkass et al. |

(Continued)

FOREIGN PATENT DOCUMENTS

| CN | 101265606 A | 9/2008 |
| CN | 106480491 A | 3/2017 |

(Continued)

OTHER PUBLICATIONS

International Search Report issued in International Application No. PCT/CN2019/084880 dated Apr. 29, 2019 (3 pages).

(Continued)

*Primary Examiner* — Hosung Chung
(74) *Attorney, Agent, or Firm* — Osha Bergman Watanabe & Burton LLP

(57) ABSTRACT

Embodiments of the present invention provide an electroplating apparatus for electroplating on a surface of a wafer, which comprising a plurality of electrodes, for forming electric fields on the surface of the wafer, an independent electric field is formed in a designated area, when a notch of the wafer is positioned within the designated area, a total amount of power received by the notch is reduced. Embodiments of the present invention also provide an electroplating method for electroplating on a surface of a wafer, the method controlling the plurality of electrodes to form electric fields on the surface of the wafer, an independent electric field is formed in a designated area, when a notch of the wafer is positioned within the designated area, a total amount of power received by the notch is reduced. The present inven- (Continued)

tion is more accurate and reliable, the electroplating efficiency is also increased.

20 Claims, 11 Drawing Sheets

(51) Int. Cl.
| | |
|---|---|
| C25D 17/00 | (2006.01) |
| C25D 17/06 | (2006.01) |
| C25D 17/12 | (2006.01) |
| C25D 21/12 | (2006.01) |
| H01L 21/288 | (2006.01) |
| H01L 21/687 | (2006.01) |
| H01L 23/544 | (2006.01) |

(52) U.S. Cl.
CPC ............ *C25D 17/12* (2013.01); *C25D 21/12* (2013.01); *H01L 21/2885* (2013.01); *H01L 21/68764* (2013.01); *H01L 23/544* (2013.01); *H01L 2223/54493* (2013.01)

(56) References Cited

U.S. PATENT DOCUMENTS

| | | | |
|---|---|---|---|
| 2005/0109611 A1 | 5/2005 | Woodruff et al. | |
| 2006/0144698 A1* | 7/2006 | Hsu ...................... | C25D 17/001 |
| | | | 204/228.1 |
| 2012/0258408 A1* | 10/2012 | Mayer ..................... | C25D 5/04 |
| | | | 430/325 |
| 2014/0367267 A1 | 12/2014 | Egan et al. | |
| 2019/0177869 A1* | 6/2019 | McHugh .............. | C25D 17/002 |

FOREIGN PATENT DOCUMENTS

| | | | |
|---|---|---|---|
| CN | 107208299 A | 9/2017 | |
| WO | WO-2008094838 A2 * | 8/2008 | ............... B23H 5/08 |

OTHER PUBLICATIONS

Written Opinion issued in International Application No. PCT/CN2019/084880 dated Apr. 29, 2019 (4 pages).
Office Action issued in corresponding CN Application No. 108115766 dated Oct. 11, 2022 (7 pages).
Decision of Refusal issued in Japanese Application No. 2020-565819, dated Jul. 4, 2023 (11 pages).

* cited by examiner

ELECTROPLATING APPARATUS AND ELECTROPLATING METHOD

BACKGROUND OF THE INVENTION

1. Field of the Invention

This invention relates to semiconductor fabrication processes and, more particularly, to electroplating processes in semiconductor fabrication processes.

2. The Related Art

Electroplating is used in both the manufacturing process and the packaging process of semiconductor chips. The wafer is placed in the plating chamber during the electroplating process. There is an anode in the plating chamber, and a wafer is used as a cathode, and a plating solution is provided in the plating chamber. Electroplating is achieved by means of electrochemical reaction. Existing electroplating equipments generally employ an electroplating apparatus having a plurality of anodes. FIG. 1 discloses a schematic structural view of an electrode of an electroplating apparatus used in the prior art. As shown in FIG. 1, the electroplating apparatus has two electrodes: a first electrode 302 and a second electrode 304. The first electrode 302 is circular and located in a central area. The second electrode 304 is annular and is located in the peripheral area. The first electrode and the second electrode function as the anode. Both the circular first electrode and the annular second electrode have a symmetrical structure, so the electric fields they generate are also symmetrical. In early time, the chips on the wafers are generally distributed in a symmetrical manner, and the wafer itself is circular, so the electrodes of this structure can complete the plating process well.

With the development of the process and the abundance of products, different demands have arisen. With the popularity of wafer-level packaging processes, there is a need for an overall plating process on wafers containing non-plated areas. A typical non-plated area is the area near the notch of the wafer. In some requirements, the dies on the wafer may be arranged in an asymmetrical manner, also forming an irregularly shaped, non-plated area. Take the non-plated area near the notch, which is more common as an example. In the plated area where the chip is arranged, there are many openings in the photoresist, and metal is deposited in the openings. These openings, which are deposited with metal, act as wires during electroplating. Since the chip is not disposed in the non-plated area, there is no opening on the photoresist and no metal deposition. Returning to FIG. 1, since the shapes of the electrodes are circular and annular, the intensity of the generated electric field is uniform. For the plated area and the non-plated area, when in a uniform electric field, since the non-plated area has no wires and cannot generate a current, it causes a larger current in the wires in the nearby areas. This makes the areas around the non-plated area to be actually at a higher current density, so that the plating rate is higher, and the final result is that the plating height is higher than other areas. For the wafer-level packaging process, the overall height control is very strict, and the high plating height near the notch of the wafer is likely to lead to product yield reduction and yield loss.

In order to solve the problem of high plating height near the notch area, one method is to use a shielding method. For example, adding a shielding plate between the wafer and the electrode, when the notch of the wafer is rotated to the position of the shielding plate, the rotation speed of the wafer is lowered, so that the notch of the wafer stays at a position covered by the shielding plate a longer time. When the notch is in the position covered by the shielding plate, the effect of receiving the electric field is weakened, and the corresponding plating rate is lowered, so that the plating height of the notch area of the wafer is lowered.

However, the implementation of this solution is difficult and has certain by-effects. This solution requires deceleration of the wafer when the wafer is rotated to a certain position and re-acceleration when it passes over the position. This requires a motor that drives a chuck to rotate with excellent acceleration and deceleration capabilities, as well as fast response times. Since the electroplating process is performed in a plating chamber, the wafer is actually immersed in a plating solution bath. The acceleration and deceleration of the rotation of the wafer can cause disturbance to the plating solution, and the disturbance of the liquid acts on the wafer, which has an unpredictable effect on the actual rotation speed of the wafer. Due to the time difference between the controller and the upper control software, the wafer often cannot start to actually decelerate or actually accelerate at the expected position, which is prone to positional deviation. This is especially true in processes with high rotation speed. For processes with rotation speeds above 50 rpm, it is very difficult to achieve precise positional acceleration and deceleration. Moreover, changing the rotation speed of the wafer will result in a decrease in the overall plating current density, which is not conducive to the increase in output.

SUMMARY

According to embodiments of the present invention, an electroplating apparatus is provided for electroplating on a surface of a wafer. The electroplating apparatus comprises a plurality of electrodes, the plurality of electrodes forming electric fields on the surface of the wafer. An independent electric field is formed in a designated area, and the intensity of the independent electric field is independently controlled. When a notch of the wafer is positioned within the designated area, a total amount of power received by the notch within the designated area is reduced.

When the notch of the wafer is positioned within the designated area, the wafer rotates at a constant speed, and the intensity of the independent electric field is changed so that the total amount of power received by the notch within the designated area is reduced. Or, when the notch of the wafer is positioned within the designated area, the intensity of the independent electric field is decreased and remains constant, and the rotation speed of the wafer is changed so that the total amount of power received by the notch within the designated area is reduced. Or, when the notch of the wafer is positioned within the designated area, both the intensity of the independent electric field and the rotation speed of the wafer are changed so that the total amount of power received by the notch within the designated area is reduced.

The electroplating apparatus further comprises a rotatable chuck, the wafer is clamped on the chuck and rotating along with the chuck, a relative position of the notch of the wafer and the chuck is fixed. The chuck may be provided with an electrode.

According to an embodiment, the electroplating apparatus comprises three electrodes: a first electrode, the first electrode being circular and covering a central area of the wafer, the first electrode being connected to a first rectifier; a second electrode, the second electrode being a ring with a notch and covering a peripheral area of the wafer, the second electrode being connected to a second rectifier; a third electrode, disposed at a position of the notch of the second electrode, the third electrode being connected to a third rectifier; wherein the first electrode, the second electrode and the third electrode collectively cover the entire area of the wafer.

According to an embodiment, the electrodes are controlled as follows: when the notch of the wafer is not positioned within the coverage area of the third electrode, the third rectifier operates in a constant current mode and outputs a constant third current; with the rotation of the wafer, when the notch of the wafer enters into the coverage area of the third electrode, the output current of the third rectifier is gradually decreased from the third current to a notch plating current; and when the notch of the wafer leaves the coverage area of the third electrode along with the rotation of the wafer, the output current of the third rectifier is gradually increased from the notch plating current to the third current.

The notch plating current may be output only instantaneously or may be output continuously for a period of time. For example, when a reference point of the notch of the wafer is aligned with a reference point of the third electrode, the third rectifier outputs the notch plating current; or when the reference point of the notch of the wafer is within a reference region of the third electrode, the third rectifier continuously outputs the notch plating current.

According to an embodiment, the electrodes are controlled as follows: when the notch of the wafer is not positioned within the coverage area of the third electrode, the third rectifier operates in a constant current mode and outputs a constant third current; with the rotation of the wafer, when the notch of the wafer enters into the coverage area of the third electrode, the third rectifier switches to a constant voltage mode, the output voltage of the third rectifier is gradually decreased from a third voltage to a notch plating voltage; and when the notch of the wafer leaves the coverage area of the third electrode along with the rotation of the wafer, the output voltage of the third rectifier is gradually increased from the notch plating voltage to the third voltage.

According to an embodiment, the electrodes are controlled as follows: the third rectifier operates in a DC pulse mode; when the notch of the wafer is not positioned within the coverage area of the third electrode, the duty cycle of the output current of the third rectifier is a high duty cycle; with the rotation of the wafer, when the notch of the wafer enters into the coverage area of the third electrode, the duty cycle of the output current of the third rectifier is gradually decreased from the high duty cycle to a low duty cycle; when the notch of the wafer leaves the coverage area of the third electrode along with the rotation of the wafer, the duty cycle of the output current of the third rectifier is gradually increased from the low duty cycle to the high duty cycle.

According to an embodiment, the electroplating apparatus comprises three electrodes: a first electrode, the first electrode being circular and covering a central area of the wafer, the first electrode being powered by a first power supply; a second electrode, the second electrode being a ring with a notch and covering a peripheral area of the wafer, the second electrode being powered by a second power supply; a third electrode, the third electrode being curved and disposed at a position of the notch of the second electrode, the third electrode being powered by a third power supply; wherein the third electrode is matched with the second electrode, the third electrode and the second electrode are spliced to form a complete ring, and the third electrode is insulated from the second electrode; wherein the first electrode, the second electrode and the third electrode collectively cover the entire area of the wafer.

According to an embodiment, the electrodes are controlled as follows: when the notch of the wafer is not positioned within the coverage area of the third electrode, the current density of the third electrode is consistent with the current density of the second electrode; with the rotation of the wafer, when the notch of the wafer enters into the coverage area of the third electrode, the current density of the third electrode is gradually decreased; when the notch of the wafer leaves the coverage area of the third electrode along with the rotation of the wafer, the current density of the third electrode is gradually increased to be consistent with the current density of the second electrode.

According to an embodiment, the electroplating apparatus comprises three electrodes: a first electrode, the first electrode being circular and covering a central area of the wafer, the first electrode being connected to a first rectifier; a second electrode, the second electrode being a ring with a notch and covering a peripheral area of the wafer, the second electrode being connected to a second rectifier; a third electrode, disposed at a position of the notch of the second electrode, the third electrode being connected to a switch, the switch being connected to the second electrode and a control power supply, the switch being switched so that the third electrode being connected to the second electrode or the control power supply; wherein the first electrode, the second electrode and the third electrode collectively cover the entire area of the wafer.

According to an embodiment, the electrodes are controlled as follows: when the notch of the wafer is not positioned within the coverage area of the third electrode, the switch makes the third electrode be connected to the second electrode, and both be connected to the second rectifier; with the rotation of the wafer, when the notch of the wafer enters into the coverage area of the third electrode, the switch makes the third electrode be connected to the control power supply, and the control power supply adjusts the duty cycle of the output current; when the notch of the wafer leaves the coverage area of the third electrode along with the rotation of the wafer, the switch makes the third electrode be connected to the second electrode.

According to an embodiment, the electroplating apparatus comprises two electrodes: a first electrode, the first electrode being circular and covering a central area of the wafer, the first electrode being provided with a concave portion and powered by a first power supply; a second electrode, the second electrode being a ring and covering a peripheral area of the wafer, the second electrode being provided with a protruding portion and powered by a second power supply; wherein the protruding portion of the second electrode is matched with the concave portion of the first electrode, the protruding portion is embedded into the concave portion, and the spliced first electrode and the second electrode collectively cover the entire area of the wafer.

According to an embodiment, the electrodes are controlled as follows: when the notch of the wafer is not positioned within the coverage area of the protruding portion, the current density of the second electrode is maintained constant; with the rotation of the wafer, when the notch of the wafer enters into the coverage area of the protruding portion, the current density of the second electrode is gradually decreased; when the notch of the wafer leaves the coverage area of the protruding portion along with the rotation of the wafer, the current density of the second electrode is gradually increased.

According to an embodiment, the electroplating apparatus comprises two electrodes: a first electrode, the first electrode being circular and the diameter of the first electrode covering the diameter of the wafer, the first electrode being provided with a notch portion and powered by a first power supply; a second electrode, disposed at the position of the notch portion of the first electrode, the second electrode being powered by a second power supply; wherein the first electrode and the second electrode collectively cover the entire area of the wafer.

According to an embodiment, the electrodes are controlled as follows: when the notch of the wafer is not positioned within the coverage area of the second electrode, the current density of the second electrode is consistent with the current density of the first electrode; with the rotation of the wafer, when the notch of the wafer enters into the coverage area of the second electrode, the current density of the second electrode is gradually decreased; when the notch of the wafer leaves the coverage area of the second electrode along with the rotation of the wafer, the current density of the second electrode is gradually increased to be consistent with the current density of the first electrode.

According to an embodiment, a plurality of independent electric fields are formed in a plurality of designated areas, and one or more independent electric fields are selected according to the notch of the wafer.

According to embodiments of the present invention, an electroplating method is provided for electroplating on a surface of a wafer by using a plurality of electrodes, the method controls the plurality of electrodes to form electric fields on the surface of the wafer. An independent electric field is formed in a designated area, the intensity of the independent electric field is independently controlled, when a notch of the wafer is positioned within the designated area, a total amount of power received by the notch within the designated area is reduced.

The electroplating method comprises the following steps:
  rotating the wafer at a constant speed;
  changing the intensity of the independent electric field when the notch of the wafer is positioned within the designated area, so that the total amount of power received by the notch within the designated area is reduced.

Or, the electroplating method comprises the following steps:
  rotating the wafer;
  when the notch of the wafer is positioned within the designated area, decreasing the intensity of the independent electric field and then remaining constant, changing the rotation speed of the wafer, so that the total amount of power received by the notch within the designated area is reduced.

Or, the electroplating method comprises the following steps:
  rotating the wafer;
  when the notch of the wafer is positioned within the designated area, changing both the intensity of the independent electric field and the rotation speed of the wafer, so that the total amount of power received by the notch within the designated area is reduced.

According to an embodiment, the independent electric field may be changed as follows:
  the independent electric field is changed by adjusting a current; or
  the independent electric field is changed by adjusting a voltage; or the independent electric field is changed by adjusting a duty cycle.

According to an embodiment, a plurality of independent electric fields are formed in a plurality of designated areas, and one or more independent electric fields are selected according to the notch of the wafer.

According to embodiments of the present invention, an electroplating apparatus is provided for electroplating on a surface of a wafer. The electroplating apparatus comprises a plurality of electrodes, and the plurality of electrodes form electric fields on the surface of the wafer. An independent electric field is formed in a designated area. The intensity of the independent electric field is independently controlled. A total amount of power received within the designated area is adjusted so as to control a plating thickness at a specified location on the surface of the wafer.

A plurality of independent electric fields may be formed in a plurality of designated areas, and the intensity of the plurality of independent electric fields is separately controlled.

According to embodiments of the present invention, an electroplating method is provided for electroplating on a surface of a wafer by using a plurality of electrodes. The method controls the plurality of electrodes forming electric fields on the surface of the wafer. An independent electric field is formed in a designated area, and the intensity of the independent electric field is independently controlled. A total amount of power received within the designated area is adjusted so as to control a plating thickness at a specified location on the surface of the wafer.

A plurality of independent electric fields may be formed in a plurality of designated areas, and the intensity of the plurality of independent electric fields is separately controlled.

The electroplating apparatus and the electroplating method of the present invention control the electroplating height of the notch of the wafer by directly controlling the intensity of the electric field. Compared with a conventional control method which only changing the rotation speed of the wafer, the present invention is more accurate and reliable, the electroplating efficiency is also increased.

BRIEF DESCRIPTION OF THE DRAWINGS

The above and other features, natures, and advantages of the invention will be apparent by the following description of the embodiments incorporating the drawings, wherein.

DETAILED DESCRIPTION OF EMBODIMENTS

Compared with controlling a rotation speed of a wafer immersed in a liquid, it is more effective to directly control the intensity of an electric field. A precise control which is more accurate may be achieved as well. If necessary, the control of the intensity of the electric field and the control of the rotation speed of the wafer may be combined so as to achieve a better control effect.

According to embodiments of the present invention, an electroplating apparatus for electroplating on a surface of a wafer is provided. The electroplating apparatus comprises a plurality of electrodes, and the plurality of electrodes form electric fields on the surface of the wafer. An independent electric field is formed in a designated area. The intensity of the independent electric field is independently controlled. When a notch of the wafer is positioned within the designated area, a total amount of power received by the notch within the designated area is reduced.

The reduction of the total amount of power received by the notch within the designated area may be realized with the following three manners:

When the notch of the wafer is positioned within the designated area, the wafer rotates at a constant speed, and the intensity of the independent electric field is changed so that the total amount of power received by the notch within the designated area is reduced. Or When the notch of the wafer is positioned within the designated area, the intensity of the independent electric field is decreased and remains constant, and the rotation speed of the wafer is changed so that the total amount of power received by the notch within the designated area is reduced. Or When the notch of the wafer is positioned within the designated area, both the intensity of the independent electric field and the rotation speed of the wafer are changed so that the total amount of power received by the notch within the designated area is reduced.

First Embodiment

Figure 1:
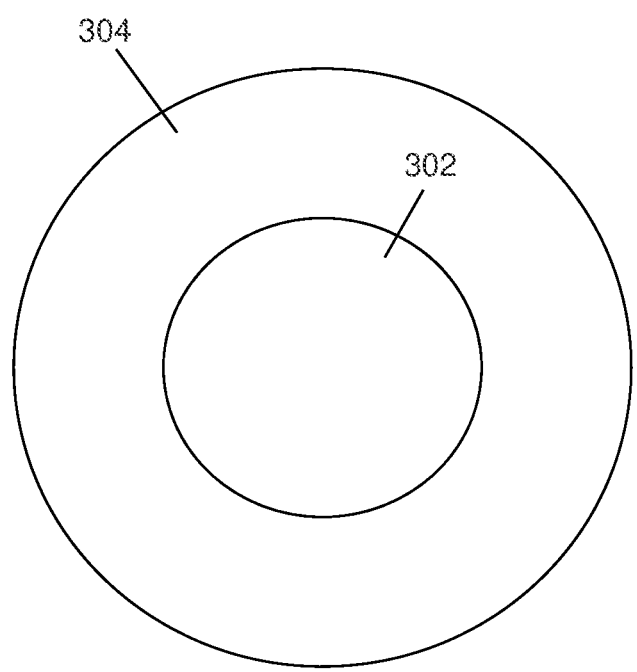
FIG. 1 illustrates a schematic structural view of electrodes of an electroplating apparatus according to prior art.
Figure 2A:
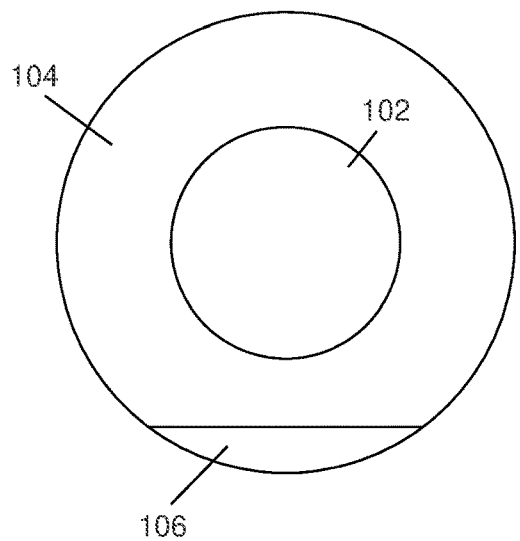
FIG. 2a, FIG. 2b and FIG. 2c illustrate schematic structural views of electrodes of an electroplating apparatus according to a first embodiment of the present invention.
Figure 2B:
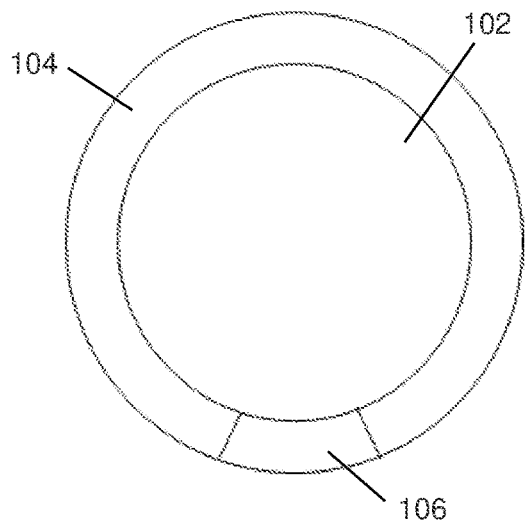
Figure 2C:
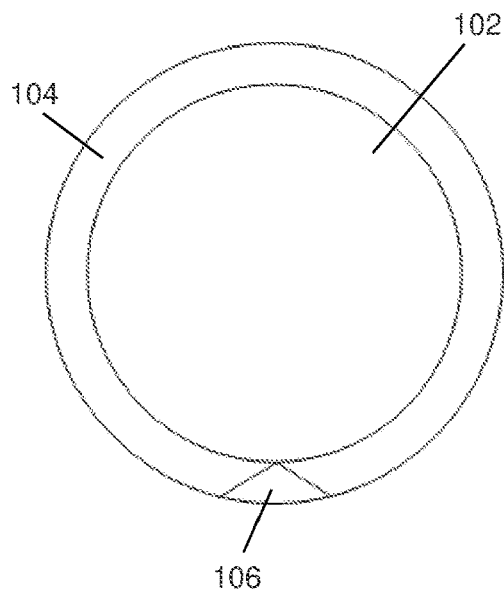

Referring to FIG. 2a, FIG. 2b and FIG. 2c, FIG. 2a, FIG. 2b and FIG. 2c illustrate schematic structural views of electrodes of an electroplating apparatus according to a first embodiment of the present invention. According to the first embodiment, the electroplating apparatus comprises three electrodes: a first electrode 102, a second electrode 104 and a third electrode 106. The first electrode 102 is circular and covers a central area of the wafer. The first electrode 102 is connected to a first rectifier. The second electrode 104 is a ring with a notch and covers a peripheral area of the wafer. The second electrode is connected to a second rectifier. The third electrode 106 is disposed at a position of the notch of the second electrode 104. The third electrode 106 is connected to a third rectifier. The first electrode 102, the second electrode 104 and the third electrode 106 collectively cover the entire area of the wafer. Dimensions of the first electrode, the second electrode, and the third electrode may be determined according to actual requirements. For example, for a wafer having a diameter of 300 mm, the radius R1 of the first electrode 102 may be between 5 mm and 145 mm. Correspondingly, the inner radius of the second electrode 104 is R1, and the outer radius R2 of the second electrode 104 may be 155 mm to 160 mm. If the diameter of the first electrode is relatively small, the annular second electrode will be relatively wide. If the first electrode is relatively large, the annular second electrode is relatively narrow. Although the inner radius of the second electrode is determined to be R1, in actual use, the inner radius of the second electrode may be slightly smaller than R1, then the first electrode and the second electrode will have an overlap at the junction so as to ensure complete coverage of the surface of the wafer. Correspondingly, the outer radius R2 of the second electrode is also slightly larger than the radius of the wafer. For example, the radius of the 300 mm diameter wafer is 150 mm, and the outer radius of the second electrode R2 is between 155 mm to 160 mm, which is slightly larger than the radius of the wafer. In a typical configuration, the first electrode has a radius of 80 mm, the second electrode has an inner radius of 80 mm, and an outer radius of 160 mm. The second electrode 104 is not a complete ring, but a ring with a notch at one end of the ring. The third electrode 106 is disposed in the notch of the second electrode, and the shape of the third electrode 106 is matched with the shape of the notch of the second electrode. When the third electrode is disposed into the notch, it just fills the entire notch. The third electrode and the second electrode collectively form a complete ring. Thus, the first electrode 102, the second electrode 104, and the third electrode 106 collectively cover the entire area on the wafer. FIG. 2a, FIG. 2b and FIG. 2c show several shapes of electrodes which are commonly used. According to FIG. 2a, the shape of the third electrode 106 is arched, with one side being a circular arc and the other side being a straight line. According to FIG. 2b, the shape of the third electrode is curved and is a part of a ring. According to FIG. 2c, the third electrode is fan shaped.

Generally, the first electrode, the second electrode, and the third electrode described above are anodes, and the wafer serves as a cathode. The anode may be made of an inert metal such as titanium or tantalum or a metal oxide material thereof, or a metal film such as platinum, gold or silver may be further plated on the above material to prolong the service life of the anode.

Figure 3:
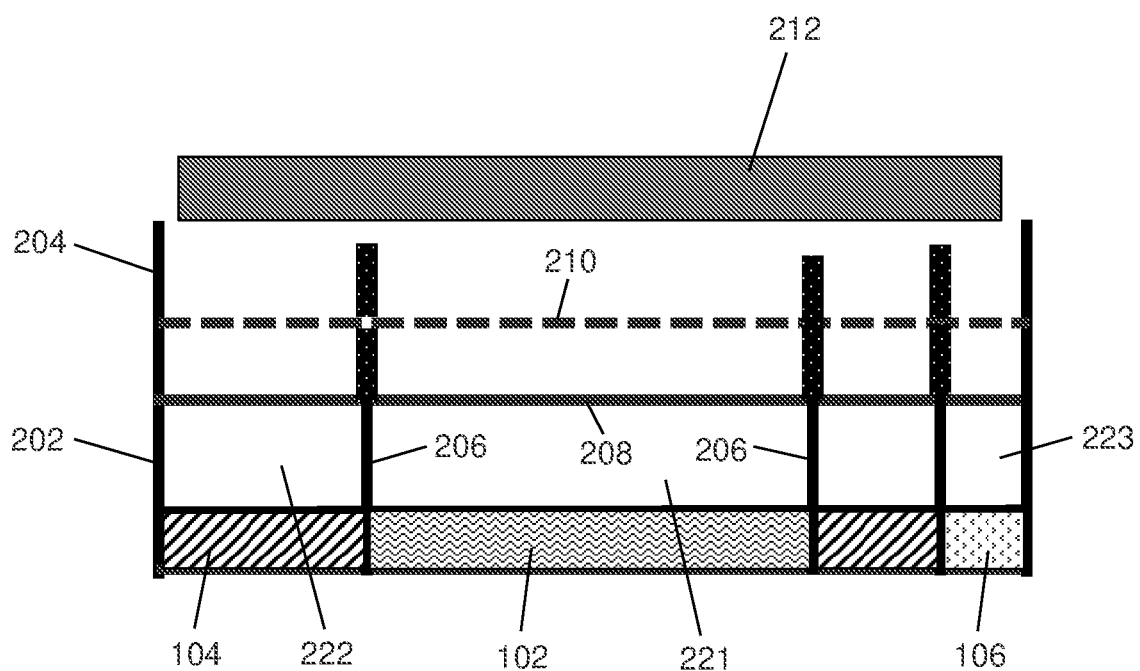
FIG. 3 illustrates a schematic sectional view of an electroplating apparatus according to a first embodiment of the present invention.

FIG. 3 illustrates a schematic sectional view of an electroplating apparatus according to a first embodiment of the present invention. According to FIG. 3, the electroplating apparatus is roughly divided into an anode chamber 202 and a cathode chamber 204. The first electrode, the second electrode, and the third electrode described above are disposed in the anode chamber 202. The anode chamber 202 is divided into a first anode region 221, a second anode region 222, and a third anode region 223 according to respective positions of the first electrode 102, the second electrode 104, and the third electrode 106. Partitions 206 are disposed between the first anode region 221, the second anode region 222, and the third anode region 223. The partitions 206 disposed between the anode regions are made of insulating material so that the electric fields in the respective anode regions are independent of each other. The electric fields in the respective anode regions are controlled by their respective electrodes. Generally, the first electrode, the second electrode, and the third electrode are disposed at the bottom of the anode chamber 202. The first anode region 221, the second anode region 222 and the third anode region 223 are formed at positions above the first electrode, the second electrode, and the third electrode. A consumable material such as a plating solution containing electroplated metal ions is placed in each anode region. Metal ions such as copper, tin, nickel, cobalt, and ruthenium may be contained according to the requirements of electroplating. In one embodiment, the first electrode, the second electrode, and the third electrode and the respective first anode region, second anode region, and third anode region have respective separate liquid circulation conduits so that each anode region forms a relative independent space in which the plating solution and the electric field are independent of each other. However, considering the requirement of metal ion concentration balance between the anode regions, small holes are formed in the partitions, through which the plating solution between the anode regions may be circulated to a certain extent to meet the requirement of metal ion concentration balance. Since the impedance of the small holes in the insulating partitions is high, the independent current control in each anode region is not substantially affected. According to the illustrated embodiment, the first electrode 102, the second electrode 104 and the third electrode 106 are all anodes and are disposed in an anode chamber at the bottom. In other embodiments, the third electrode 106 may also be disposed on a chuck. The electrode disposed on the chuck may be an anode or a cathode. For electrodes disposed on a chuck, the "electrode" is a broad definition, and devices that achieve the purpose of adjusting the electric field can be considered as "electrodes."

Continue with FIG. 3, an ionic membrane 208 is disposed between the anode chamber 202 and the cathode chamber 204. The ionic membrane can control the ion strike between the anode chamber 202 and the cathode chamber 204, so as to form a relatively stable plating fluid and supplement consumable metal ions and achieve fast mass exchange. The partition 206 extends from the anode chamber 202 into the cathode chamber 204 and continues upwardly in the cathode chamber 204 until it is near the wafer. Thereby, a first cathode region, a second cathode region, and a third cathode region corresponding to the first anode region 221, the second anode region 222, and the third anode region 223, respectively, are also formed in the cathode chamber 204. Small holes may be provided in the partitions 206 in the cathode chamber to meet the requirement of metal ion concentration balance. Or there may be no small hole in the partitions 206 in the cathode chamber, so that the respective cathode regions in the cathode chamber are better isolated. A flow field plate 210 is also disposed in the cathode chamber at a position close to the wafer.

The wafer 212 in FIG. 3 is clamped by a chuck. The chuck is rotatable. The wafer 212 is clamped on the chuck and rotates along with the chuck. A relative position of the notch of the wafer and the chuck is fixed, so that the position of the notch can be determined according to the rotation position of the chuck. During an electroplating process, the chuck brings the wafer to rotate, such as at a rotation speed of 10 rpm. It is also possible to perform forward and reverse alternate rotation. The chuck and wafer may rotate in forward direction for a certain period of time, and then change to a reverse direction. The rotation speed may be maintained at 10 rpm. And then after the same period of time, it is converted to the forward direction again and the rotation speed is unchanged. Repeat such a mode alternately. During the rotation, except for the time of the conversion between the forward and reverse direction, the rotation of the wafer is performed at a constant speed. The rotation speed may be from 0.1 rpm to 500 rpm, and is determined according to actual conditions.

From a cross-sectional perspective, the electroplating apparatus of the present invention is similar to prior art in the structures of the electrodes, the anode chamber, the cathode chamber, the ionic membrane, the flow field plate and the like, and the basic processes of electroplating. Embodiments of the present invention mainly focus on the configuration and arrangement of the third electrode, as shown in FIG. 2a, FIG. 2b and FIG. 2c.

Embodiments of the present invention hope to independently control the electric field in the region of the notch of the wafer, form an independent electric field in the region of the notch of the wafer, and the intensity of this electric field is weaker than that of the remaining regions, thereby controlling the plating height near the notch of the wafer.

According to the first embodiment, the first electrode, the second electrode, and the third electrode are respectively controlled by a first rectifier, a second rectifier, and a third rectifier which are independent to each other. The operation modes of the first rectifier and the second rectifier are similar to the prior art. For example, the first rectifier may output DC or pulse current. The maximum current of the first rectifier may be set to 20 A, and the maximum voltage of the first rectifier may be set to 40V. The second rectifier may output DC or pulse current. The maximum current of the second rectifier may be set to 30 A, and the maximum voltage of the second rectifier may be set to 40V. The maximum current and the maximum voltage of the rectifiers are usually set according to the area size of the electrodes. A third rectifier is used to control the third electrode. The third rectifier may also output DC or pulse current. The maximum current of the third rectifier may be set at 5 A, and the maximum voltage of the third rectifier may be set to 60V. If pulse current is used, the pulse frequency of the third rectifier may be set from 0.1 ms to 2000 ms.

According to the first embodiment, the operation mode of the third rectifier may be as follows: when the notch of the wafer is not positioned within the coverage area of the third electrode, the third rectifier operates in a constant current mode and outputs a constant third current. With the rotation of the wafer, when the notch of the wafer enters into the coverage area of the third electrode, the output current of the third rectifier is gradually decreased from the third current to a notch plating current. And, when the notch of the wafer leaves the coverage area of the third electrode along with the rotation of the wafer, the output current of the third rectifier is gradually increased from the notch plating current to the third current. Because the wafer is clamped on the chuck and rotates along with the chuck, the relative position of the notch of the wafer and the chuck is fixed. The position of the notch can be determined by detecting the rotation position of the chuck. When the notch of the wafer begins to enter into the coverage area of the third electrode, the third rectifier decreases the output current so that the electric field generated by the third electrode is weakened.

Figure 4:
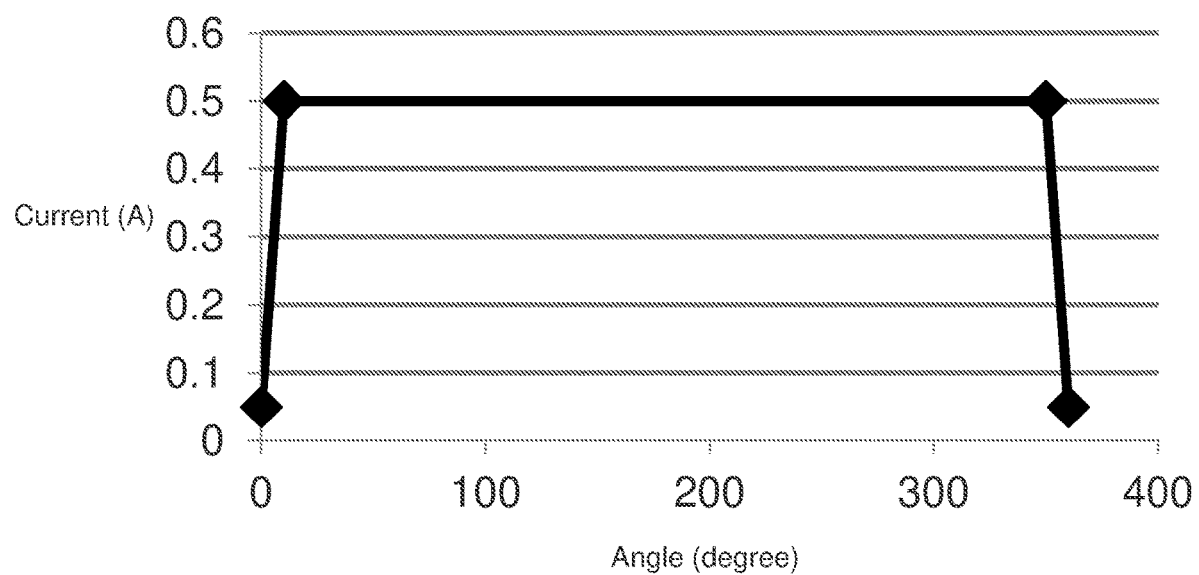
FIG. 4 illustrates a waveform of an output current of a third rectifier in an electroplating apparatus according to a first embodiment of the present invention.

FIG. 4 illustrates a waveform of an output current of a third rectifier in an electroplating apparatus according to a first embodiment of the present invention. According to the first embodiment, the notch and the third electrode are completely aligned at a position of 0 degree, and the notch is within the coverage area of the third electrode in a range between 350 degrees to 10 degrees. When the notch is in a position between 10 degrees to 350 degrees, the notch is not positioned within the coverage area of the third electrode, and the third rectifier outputs a constant third current of 0.5 A. When the notch is rotated to the position of 350 degrees, the output current of the third rectifier begins to decrease. During the rotation process from 350 degrees to 360 degrees (0 degree), the output current of the third rectifier is gradually decreased from the third current 0.5 A to a notch plating current 0.05 A. And during the rotation process from 0 degree to 10 degrees, the output current of the third rectifier is gradually increased from the notch plating current 0.05 A to the third current 0.5 A. The processes of gradually decreasing and gradually increasing the output current of the third rectifier may be a linear change or a nonlinear change. According to the embodiment shown in FIG. 4, the processes of gradually decreasing and gradually increasing the output current of the third rectifier are linear.

Second Embodiment

The structure of the electroplating apparatus of the second embodiment is the same as that of the first embodiment, and the description thereof will not be repeated here. The second embodiment differs from the first embodiment in that the control mode of the third rectifier is slightly different. According to the second embodiment, the third rectifier adopts the following operation mode: when the notch of the wafer is not positioned within the coverage area of the third electrode, the third rectifier operates in a constant current mode and outputs a constant third current. With the rotation of the wafer, when the notch of the wafer enters into the coverage area of the third electrode, the output current of the third rectifier is gradually decreased from the third current to a notch plating current. And when the notch of the wafer leaves the coverage area of the third electrode along with the rotation of the wafer, the output current of the third rectifier is gradually increased from the notch plating current to the third current. According to the first embodiment, the notch plating current occurs only in an instant, that is, when the reference point of the notch is aligned with the reference point of the third electrode, in this embodiment at the 0 degree position, the third rectifier outputs the notch plating current. However, according to the second embodiment, the notch plating current is continuously outputted for a period of time. When the reference point of the notch is within a reference region of the third electrode, the third rectifier continuously outputs the notch plating current.

Figure 5:
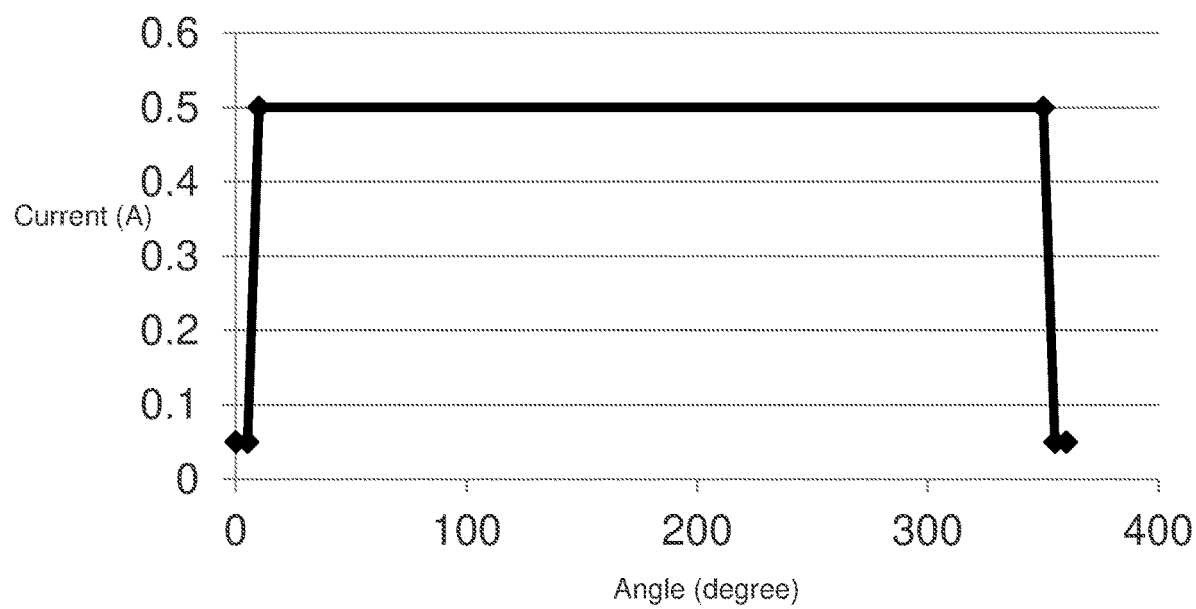
FIG. 5 illustrates a waveform of an output current of a third rectifier in an electroplating apparatus according to a second embodiment of the present invention.
Figure 6:
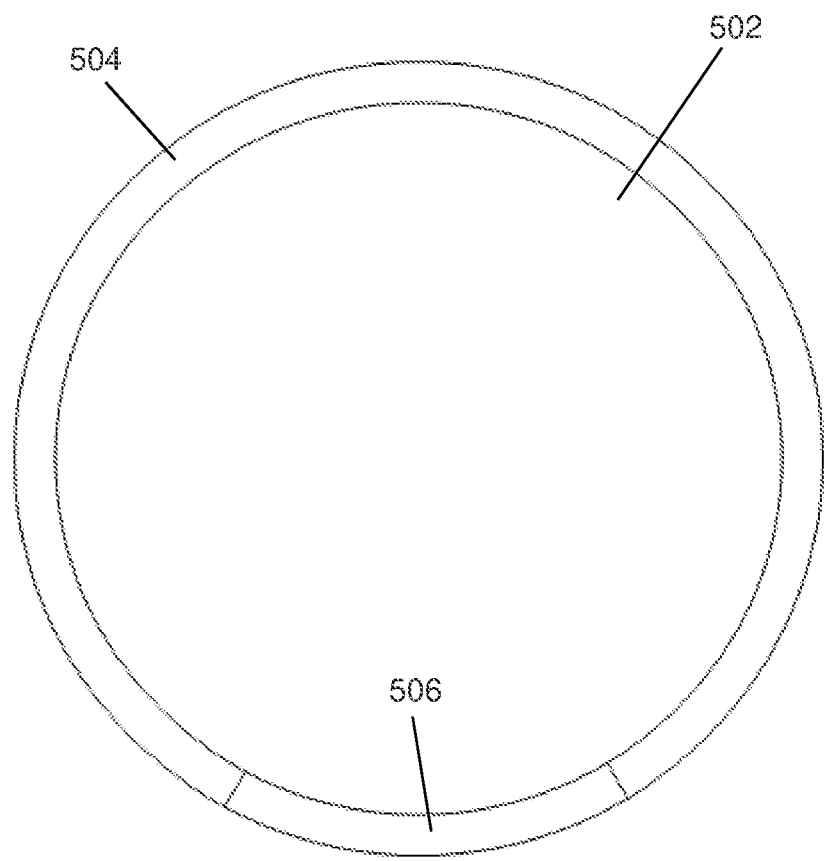
FIG. 6 illustrates a schematic structural view of electrodes of an electroplating apparatus according to a fifth embodiment of the present invention.

FIG. 5 illustrates a waveform of an output current of a third rectifier in an electroplating apparatus according to a second embodiment of the present invention. According to the second embodiment, the position where the notch of the wafer and the third electrode are completely aligned, that is, the reference point of the notch is aligned with the reference point of the third electrode, in this embodiment is at the 0 degree position. Within the range from 350 degrees to 10 degrees, the notch of the wafer enters into the coverage area of the third electrode. And within the range from 355 degrees to 5 degrees, the reference point of the notch is within the reference region of the third electrode. When the notch of the wafer is between 10 degrees and 350 degrees, the notch of the wafer does not enter into the coverage area of the third electrode. At this time, the third rectifier outputs a constant third current of 0.5 A. When the notch of the wafer is rotated to the position of 350 degrees, the output current of the third rectifier begins to decrease. During the rotation process from 350 degrees to 355 degrees, the output current of the third rectifier is gradually decreased from the third current 0.5 A to the notch plating current 0.05 A. During the rotation process from 355 degrees to 5 degrees, the reference point of the notch is within the reference area of the third electrode, and the third rectifier constantly outputs the notch plating current of 0.05 A. During the rotation process from 5 degrees to 10 degrees, the output current of the third rectifier is gradually increased from the notch plating current 0.05 A to the third current 0.5 A. The processes of gradually decreasing and gradually increasing the output current of the third rectifier may be a linear change or a nonlinear change. According to the embodiment shown in FIG. 5, the processes of gradually decreasing and gradually increasing the output current of the third rectifier are linear.

Third Embodiment

The structure of the electroplating apparatus of the third embodiment is the same as that of the first embodiment, and the description thereof will not be repeated here. The third embodiment differs from the first embodiment in that the control mode of the third rectifier is slightly different. According to the first embodiment and the second embodiment, the third rectifier always operates in a constant current mode. However, according to the third embodiment, the third rectifier switches to a constant voltage mode when the notch of the wafer enters into the coverage area of the third electrode. When the notch of the wafer is not positioned within the coverage area of the third electrode, the third rectifier operates in a constant current mode and outputs a constant third current. With the rotation of the wafer, when the notch of the wafer enters into the coverage area of the third electrode, the third rectifier switches to a constant voltage mode, the output voltage of the third rectifier is gradually decreased from a third voltage to a notch plating voltage. And when the notch of the wafer leaves the coverage area of the third electrode along with the rotation of the wafer, the output voltage of the third rectifier is gradually increased from the notch plating voltage to the third voltage. When switching to the constant voltage mode, the output voltage of the third rectifier is higher than a threshold voltage of the electroplating electrochemical reaction, that is, the notch plating voltage is higher than the threshold voltage of the electroplating electrochemical reaction. At the threshold voltage, the electroplating electrochemical reaction and the plating solution corrosion reaction offset each other, so that the actual plating rate is almost zero, but it can also ensure that within the third electrode coverage area, the metal already plated on the wafer will not disappear because of the corrosion of the plating solution.

In addition, the constant voltage mode has an additional benefit: when the notch of the wafer enters into the coverage area of the third electrode, the actual current is automatically decreased. Since the notch of the wafer is a non-plated area, the resistance of the non-plated area is larger than that of the plated area. In the constant voltage mode, during the process of the notch entering the coverage area of the third electrode, the resistance is continuously increased, so that the current in this region is continuously decreased. When the notch leaves the coverage area of the third electrode, the resistance decreases while the current increases.

According to the third embodiment, the position where the notch of the wafer and the third electrode are completely aligned, that is, the reference point of the notch is aligned with the reference point of the third electrode, in this embodiment is at the 0 degree position. Within the range from 350 degrees to 10 degrees, the notch of the wafer enters into the coverage area of the third electrode. And within the range from 355 degrees to 5 degrees, the reference point of the notch is within the reference region of the third electrode. When the notch of the wafer is between 10 degrees and 350 degrees, the notch of the wafer does not enter into the coverage area of the third electrode. At this time, the third rectifier operates in the constant current mode and outputs a constant third current of 0.5 A. When the notch of the wafer is rotated to a position of 350 degrees, the third rectifier is switched to the constant voltage mode, and the initial value of the output voltage is the third voltage of 0.5V. During the rotation process from 350 degrees to 355 degrees, the output voltage of the third rectifier is gradually decreased from the initial third voltage 0.5V to a notch plating voltage of 0.05V. During the rotation process from 355 degrees to 5 degrees, the reference point of the notch is within the reference area of the third electrode, and the third rectifier constantly outputs the notch plating voltage 0.05V. During the rotation process from 5 degrees to 10 degrees, the output voltage of the third rectifier is gradually increased from the notch plating voltage 0.05V to the third voltage 0.5V. The processes of gradually decreasing and gradually increasing the output voltage of the third rectifier may be a linear change or a nonlinear change.

Fourth Embodiment

The structure of the electroplating apparatus of the fourth embodiment is the same as that of the first embodiment, and the description thereof will not be repeated here. The fourth embodiment differs from the first embodiment in that the control mode of the third rectifier is slightly different. The third rectifier operates in a DC pulse mode. When the notch of the wafer is not positioned within the coverage area of the third electrode, the duty cycle of the output current of the third rectifier is a high duty cycle. With the rotation of the wafer, when the notch of the wafer enters into the coverage area of the third electrode, the duty cycle of the output current of the third rectifier is gradually decreased from the high duty cycle to a low duty cycle. When the notch of the wafer leaves the coverage area of the third electrode along with the rotation of the wafer, the duty cycle of the output current of the third rectifier is gradually increased from the low duty cycle to the high duty cycle. The third rectifier operated in DC pulse mode has a fast response, which can more accurately control the plating height of the notch area, and is more suitable for processes with a high rotation speed of the wafer. For processes with a rotation speed above 20 rpm, a third rectifier operated in DC pulse mode can be used. For processes with a rotation speed above 50 rpm or even above 100 rpm, the advantages of the third rectifier operated in DC pulse mode are even more pronounced.

According to the fourth embodiment, the position where the notch of the wafer and the third electrode are completely aligned, that is, the reference point of the notch is aligned with the reference point of the third electrode, in this embodiment is at the 0 degree position. Within the range from 350 degrees to 10 degrees, the notch of the wafer enters into the coverage area of the third electrode. And within the range from 355 degrees to 5 degrees, the reference point of the notch is within the reference region of the third electrode. When the notch of the wafer is between 10 degrees and 350 degrees, the notch of the wafer does not enter into the coverage area of the third electrode. At this time, the duty cycle of the output current of the third rectifier is a high duty cycle, for example, the duty cycle is 100%, and the third rectifier continuously outputs a current of 0.5 A in a DC pulse manner. When the notch of the wafer is rotated to a position of 350 degrees, the third rectifier begins to decrease the duty cycle of the output current. During the rotation process from 350 degrees to 355 degrees, the duty cycle of the output current of the third rectifier is decreased from the initial 100% to 5%. During the rotation process from 355 degrees to 5 degrees, the reference point of the notch is within the reference region of the third electrode, and the duty cycle of the current outputted by the third rectifier is maintained at 5%. During the rotation process from 5 degrees to 10 degrees, the duty cycle of the output current of the third rectifier is increased from 5% to 100%. The duty cycle variation of the output current of the third rectifier may be a linear change or a non-linear change.

Fifth Embodiment

The structure of the electroplating apparatus of the fifth embodiment is slightly different from that of the first embodiment. According to the fifth embodiment, the electroplating apparatus comprises three electrodes: a first electrode 502, a second electrode 504 and a third electrode 506. The first electrode 502 is circular and covers a central area of the wafer. The first electrode is powered by a first power supply. The second electrode 504 is a ring with a notch and covers a peripheral area of the wafer. The second electrode is powered by a second power supply. The third electrode 506 is curved and disposed at a position of the notch of the second electrode. The third electrode is powered by a third power supply. An arc of the third electrode 506 is matched with the ring of the second electrode 504. The third electrode 506 and the second electrode 504 are spliced to form a complete ring. The third electrode 506 is insulated from the second electrode 504. The first electrode 502, the second electrode 504 and the third electrode 506 collectively cover the entire area of the wafer. Dimensions of the first electrode, the second electrode, and the third electrode may be determined according to actual requirements, as in the previous first embodiment, and the description thereof will not be repeated here.

The cross-sectional structure of the electroplating apparatus of the fifth embodiment is similar to that of the foregoing embodiment, and also has electrodes, an anode chamber, a cathode chamber, an ionic membrane, a flow field plate and the like, and will not be repeated in detail herein.

The third electrode according to the fifth embodiment operates as follows: when the notch of the wafer is not positioned within the coverage area of the third electrode, the current density of the third electrode is consistent with the current density of the second electrode. With the rotation of the wafer, when the notch of the wafer enters into the coverage area of the third electrode, the current density of the third electrode is gradually decreased. When the notch of the wafer leaves the coverage area of the third electrode along with the rotation of the wafer, the current density of the third electrode is gradually increased to be consistent with the current density of the second electrode. Thus, when the notch of the wafer is within the coverage area of the third electrode, the current density of the third electrode is decreased, thereby achieving the purpose of controlling and reducing the plating height of the notch area of the wafer.

Sixth Embodiment

The structure of the electroplating apparatus of the sixth embodiment is slightly different from that of the first embodiment. According to the sixth embodiment, the electroplating apparatus comprises three electrodes: a first electrode, a second electrode and a third electrode. The first electrode is circular and covers a central area of the wafer. The first electrode is connected to a first rectifier. The second electrode is a ring with a notch and covers a peripheral area of the wafer. The second electrode is connected to a second rectifier. The third electrode is disposed at a position of the notch of the second electrode. The third electrode is connected to a switch rather than a separate third rectifier. The switch is connected to the second electrode and a control power supply. The switch is switched so that the third electrode is connected to the second electrode or the control power supply. The first electrode, the second electrode and the third electrode collectively cover the entire area of the wafer. Dimensions of the first electrode, the second electrode, and the third electrode can be determined according to actual requirements. The shape of the notch on the second electrode and the shape of the third electrode are determined according to the coating shape of the photoresist at the notch of the wafer. The shape of the notch of the second electrode and the shape of the third electrode are matched with the coating shape of the photoresist at the notch of the wafer.

The third electrode according to the sixth embodiment operates as follows: when the notch of the wafer is not positioned within the coverage area of the third electrode, the switch makes the third electrode be connected to the second electrode, and both be connected to the second rectifier. The third electrode and the second electrode are powered by the second rectifier. With the rotation of the wafer, when the notch of the wafer enters into the coverage area of the third electrode, the switch makes the third electrode be disconnected with the second electrode and be connected to the control power supply. The control power supply adjusts the duty cycle of the output current. When the notch of the wafer leaves the coverage area of the third electrode along with the rotation of the wafer, the switch makes the third electrode be connected to the second electrode again. The control power supply outputs a DC pulse current, when the notch of the wafer is within the coverage area of the third electrode, the operation mode of the control power supply is similar to that of the fourth embodiment.

Seventh Embodiment

Figure 7:
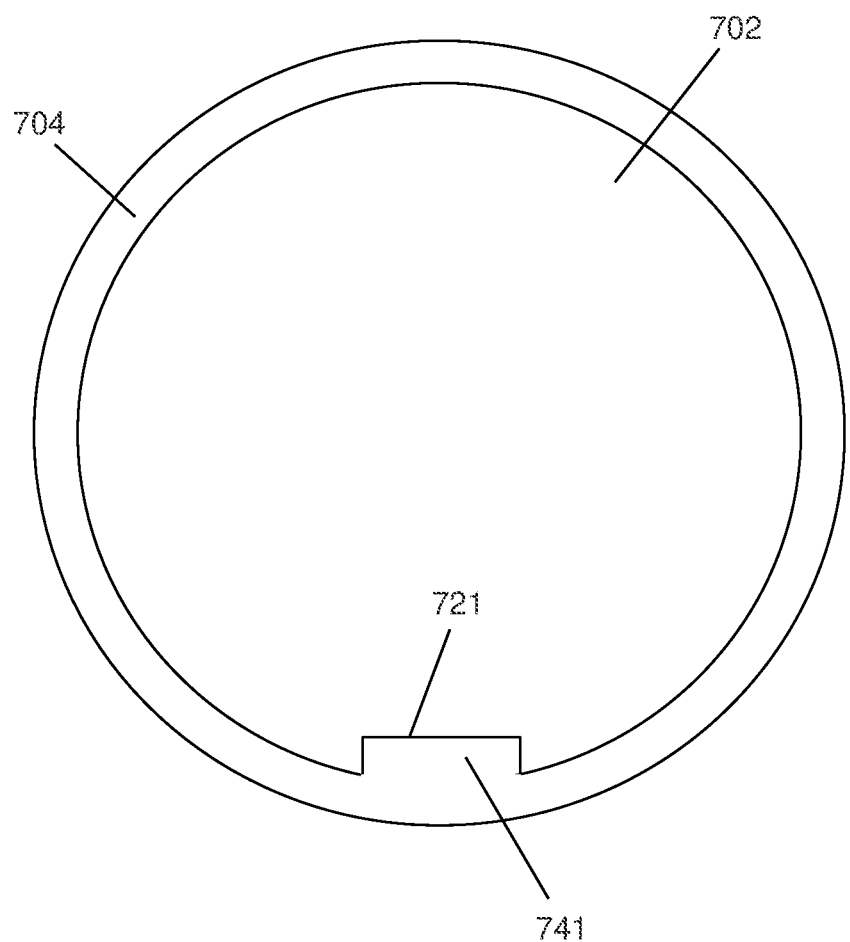
FIG. 7 illustrates a schematic structural view of electrodes of an electroplating apparatus according to a seventh embodiment of the present invention.

FIG. 7 illustrates a schematic structural view of electrodes of an electroplating apparatus according to a seventh embodiment of the present invention. The structure of the electroplating apparatus of the seventh embodiment is different from that of the previous embodiments. According to the seventh embodiment, the electroplating apparatus only comprises two electrodes: a first electrode 702 and a second electrode 704. The first electrode 702 is circular and covers a central area of the wafer. The first electrode is provided with a concave portion 721 and is powered by a first power supply. The second electrode 704 is a ring and covers a peripheral area of the wafer. The second electrode 704 is provided with a protruding portion 741 and is powered by a second power supply. The protruding portion 741 of the second electrode 704 is matched with the concave portion 721 of the first electrode 702, the protruding portion 741 is embedded into the concave portion 721, and the spliced first electrode 702 and the second electrode 704 collectively cover the entire area of the wafer. Dimensions of the first electrode and the second electrode can be determined according to actual requirements, as in the previous embodiment, and the description is not repeated here.

The cross-sectional structure of the electroplating apparatus of the seventh embodiment is similar to that of the foregoing embodiment, and also has electrodes, an anode chamber, a cathode chamber, an ionic membrane, a flow field plate and the like, and will not be repeated in detail herein.

The second electrode according to the seventh embodiment operates as follows: when the notch of the wafer is not positioned within the coverage area of the protruding portion, the current density of the second electrode is maintained constant at a normal level. With the rotation of the wafer, when the notch of the wafer enters into the coverage area of the protruding portion, the current density of the second electrode is gradually decreased. When the notch of the wafer leaves the coverage area of the protruding portion along with the rotation of the wafer, the current density of the second electrode is gradually increased. Then the purpose of controlling and reducing the plating height of the notch area is achieved.

The seventh embodiment has one electrode reduced as compared with the previous embodiments, and only two electrodes are employed. The structure and control are simpler than the foregoing embodiments, but the purpose of controlling the plating height of the notch area can also be achieved. The implementation of the seventh embodiment is lower in cost and more economical.

Eighth Embodiment

Figure 8:
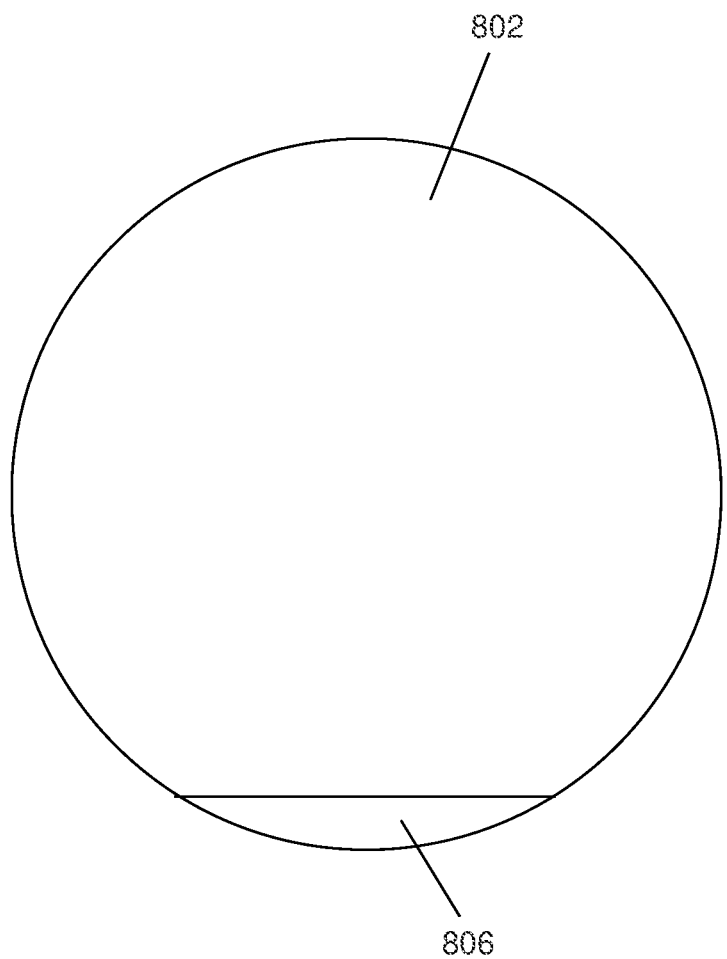
FIG. 8 illustrates a schematic structural view of electrodes of an electroplating apparatus according to an eighth embodiment of the present invention.

FIG. 8 illustrates a schematic structural view of electrodes of an electroplating apparatus according to an eighth embodiment of the present invention. The electroplating apparatus according to the eighth embodiment also has only two electrodes: a first electrode 802 and a second electrode 806. The first electrode 802 is circular and the diameter of the first electrode covers the diameter of the wafer. The first electrode 802 is provided with a notch portion and the first electrode is powered by a first power supply. The second electrode 806 is disposed at the position of the notch portion of the first electrode 802. The second electrode 806 is powered by a second power supply. The first electrode 802 and the second electrode 806 collectively cover the entire area of the wafer. Dimensions of the first electrode and the second electrode can be determined according to actual needs, as in the previous embodiment, and the description is not repeated here.

The cross-sectional structure of the electroplating apparatus of the eighth embodiment is similar to that of the foregoing embodiment, and also has electrodes, an anode chamber, a cathode chamber, an ionic membrane, a flow field plate and the like, and will not be repeated in detail herein.

The second electrode according to the eighth embodiment operates as follows: when the notch of the wafer is not positioned within the coverage area of the second electrode, the current density of the second electrode is consistent with the current density of the first electrode. With the rotation of the wafer, when the notch of the wafer enters into the coverage area of the second electrode, the current density of the second electrode is gradually decreased. When the notch of the wafer leaves the coverage area of the second electrode along with the rotation of the wafer, the current density of the second electrode is gradually increased to be consistent with the current density of the first electrode.

The eighth embodiment employs two electrodes as compared with the foregoing embodiment. One is a circular electrode with a notch and the other is an electrode positioned at the location of the notch. No ring electrode is used. The eighth embodiment is primarily directed to wafers with a relatively small diameter, such as 8-inch wafers. For a wafer with a relatively small size, it can be covered by only one circular electrode and one notch electrode, and no additional ring electrodes are needed for covering the peripheral area of the wafer.

In the first to eighth embodiments described above, the adjustment of the electric field intensity is taken as an example for explanation. That is, the first of the three ways to achieve a reduction in the total amount of power received by the notch of the wafer within the designated area: the wafer rotates at a constant speed, and the intensity of the independent electric field is changed so that the total amount of power received by the notch of the wafer within the designated area is reduced.

Based on the foregoing embodiments, combined with the control of the rotation speed of the wafer, for example, decreasing the rotation speed of the wafer when the notch of the wafer enters into the coverage area of the third electrode (the second electrode in the eighth embodiment) or the protruding portion, then the second way can be achieved: when the notch of the wafer is positioned within the designated area, the intensity of the independent electric field is decreased and remains constant, and the rotation speed of the wafer is changed so that the total amount of power received by the notch of the wafer within the designated area is reduced. Combining the control of the intensity of the electric field and the control of the rotation speed of the wafer will result in a better plating height control.

For the third method, similar to the method used in the prior art, it mainly relies on changing the rotation speed of the wafer. However, when the notch of the wafer enters into the designated area, the intensity of the independent electric field of this area is lowered and constant at a lower value.

The foregoing first to eighth embodiments can also be summarized as an electroplating method. The electroplating method electroplates on a surface of a wafer by using a plurality of electrodes, the method controls the plurality of electrodes to form electric fields on the surface of the wafer, wherein an independent electric field is formed in a designated area, the intensity of the independent electric field is independently controlled, when a notch of the wafer is positioned within the designated area, a total amount of power received by the notch within the designated area is reduced.

The electroplating method comprises the following steps:
rotating the wafer at a constant speed;
changing the intensity of the independent electric field when the notch of the wafer is positioned within the designated area, so that the total amount of power received by the notch within the designated area is reduced.

Or, the electroplating method comprises the following steps:
rotating the wafer;
when the notch of the wafer is positioned within the designated area, decreasing the intensity of the independent electric field and then remaining constant, changing the rotation speed of the wafer, so that the total amount of power received by the notch within the designated area is reduced.

Or, the electroplating method comprises the following steps:
rotating the wafer;
when the notch of the wafer is positioned within the designated area, changing both the intensity of the independent electric field and the rotation speed of the wafer, so that the total amount of power received by the notch within the designated area is reduced.

When the notch of the wafer enters into the area of the independent electric field, the total amount of power received by the notch area is reduced, so that the plating height of the notch area is reduced. Then the requirements of package, especially the requirements of wafer level package are satisfied.

Similarly, the electroplating method may also be combined with the control of a rotation speed of the wafer. When the notch of the wafer enters into the coverage area of the third electrode or the protruding portion, the rotation speed of the wafer is reduced. Combining the control of the intensity of the electric field and the control of the rotation speed of the wafer will result in a better plating height control.

The adjustment of the independent electric field can be achieved by adjusting the current, adjusting the voltage or by adjusting the duty cycle. The intensity variation of the independent electric field can be linear or non-linear.

The foregoing first to eighth embodiments are mainly directed to the control of the plating height of the notch area of the wafer. According to an extension of the embodiments of the invention, it is also possible to extend the designated area from the notch area to the entire edge area of the wafer. With the expansion of the wafer product line, there are more and more asymmetric and uneven arrangements on the wafer. In addition to the notch area, there is also a problem of plating height control in the entire edge area of the wafer.

In addition, in order to increase production efficiency, it is desirable to speed up the plating process. An important means to speed up the plating process is to increase the plating current. The plating efficiency can be increased by using high-current plating. However, one by-effect of high-current plating is that the uniformity of plating will reduce, especially in the edge area of the wafer. The uniformity is more susceptible when a high-current is used.

As an extension, embodiments of the present invention provides an electroplating apparatus for electroplating on a surface of a wafer, the electroplating apparatus comprises a plurality of electrodes, the plurality of electrodes forming electric fields on the surface of the wafer. A plurality of independent electric fields are formed in a plurality of designated areas, and the intensity of the plurality of independent electric fields are separately controlled. The total amount of power received within the designated areas is adjusted so as to control a plating thickness at a specified location on the surface of the wafer.

Ninth Embodiment

Figure 9A:
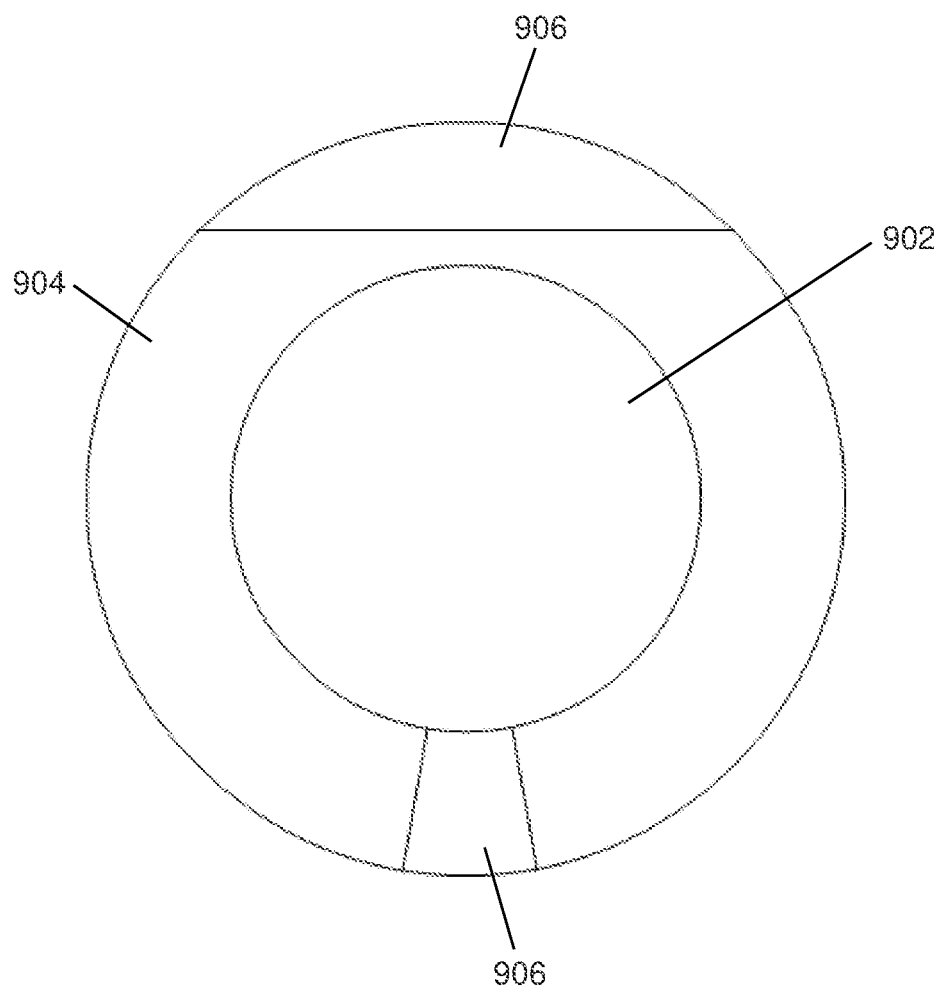
FIG. 9a and FIG. 9b illustrate schematic structural views of electrodes of an electroplating apparatus according to a ninth embodiment of the present invention.
Figure 9B:
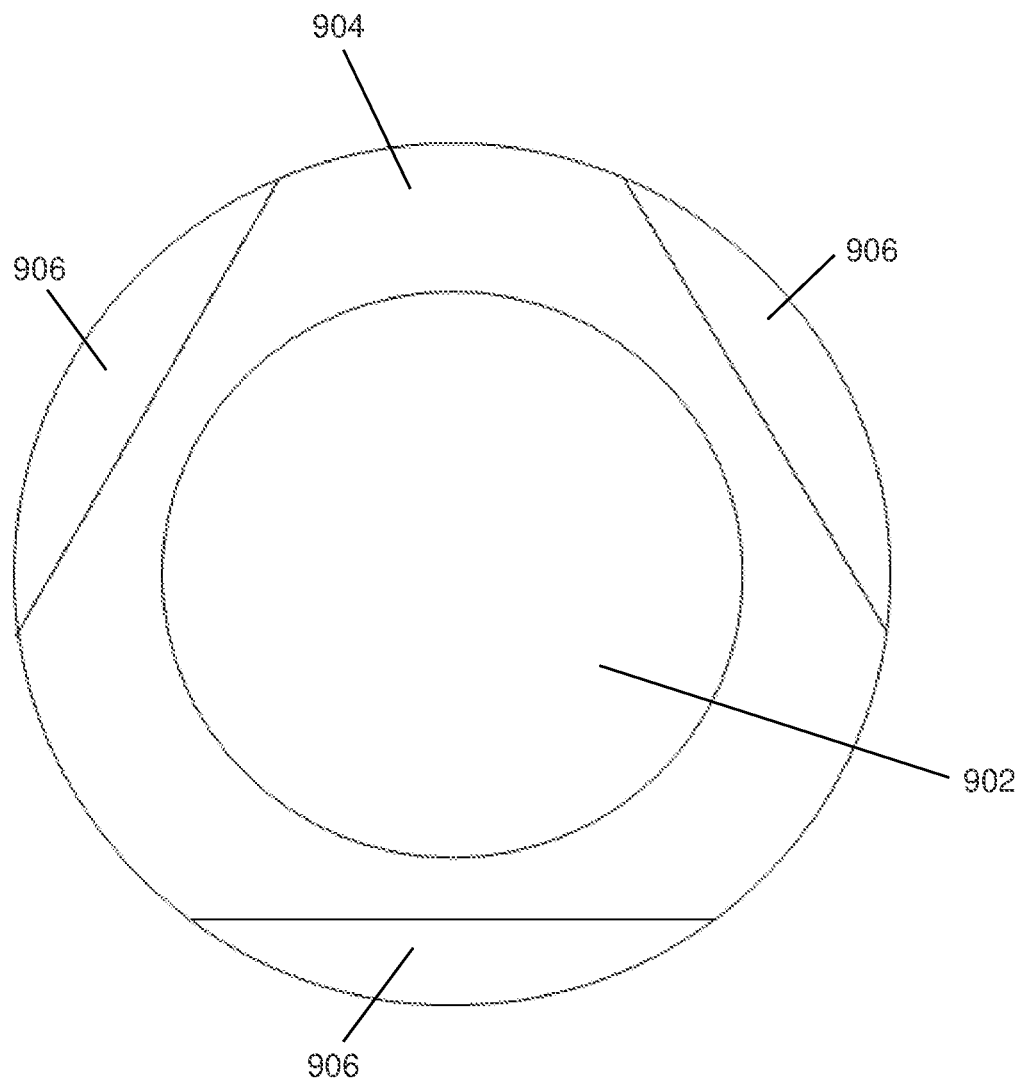

FIG. 9a and FIG. 9b illustrate schematic structural views of electrodes of an electroplating apparatus according to a ninth embodiment of the present invention. According to the ninth embodiment shown in FIG. 9a and FIG. 9b, the electroplating apparatus has three sets of electrodes: a first electrode 902, a second electrode 904 and third electrodes 906. It should be noticed that, the number of third electrodes 906 is several instead of only one third electrode as shown in the previous embodiments. The first electrode 902 is circular and covers a central area of the wafer. The second electrode is a ring with a plurality of notches and covers a peripheral area of the wafer. Several third electrodes 906 are disposed at positions of the notches of the second electrode 904. The first electrode 902, the second electrode 904 and the third electrodes 906 collectively cover the entire area of the wafer. Dimensions of the first electrode, the second electrode, and the third electrodes can be determined according to actual requirements. In the illustrated embodiment, the notches on the second electrode 904 are distributed over the circumference, and correspondingly, the third electrodes 906 are also disposed on the circumference. In the embodiment shown in FIG. 9a, two notches are distributed on the second electrode 904 at intervals of 180 degrees, and the two third electrodes 906 are also arranged at intervals of 180 degrees. In the embodiment shown in FIG. 9b, the second electrode 904 has three notches distributed at intervals of 120 degrees, and the three third electrodes 906 are also arranged at intervals of 120 degrees. Also, the shape and size of the notches of the second electrode and the corresponding third electrodes may be different. For example, in FIG. 9a, the two third electrodes 906 are shown as having different shapes and sizes. While in FIG. 9b, the three third electrodes 906 are shown as having the same shape and size. The third electrodes and the notches on the second electrode may be uniformly arranged on the circumference or may be unevenly arranged. Uniform placement is more conducive to control.

When there are a plurality of third electrodes, the control manner of each of the third electrodes can refer to the operation modes in the foregoing first to sixth embodiments. When the notch of the wafer is rotated into the coverage area of a certain third electrode, the electric field generated by the third electrode is weakened, and when the notch of the wafer leaves from the coverage area of the third electrode, the electric field generated by the third electrode is enhanced. The third electrode may be provided with a separate third rectifier or may be switched between the second electrode and the control power supply via a switch. The electric field of the third electrode may be controlled in a constant current mode, a constant voltage mode, or a mode in which the duty cycle is adjusted. These contents have been described in the foregoing first to sixth embodiments, and those skilled in the art can apply them to the ninth embodiment.

An advantage of a configuration employing multiple third electrodes is that control over the entire edge area of the wafer can be achieved. The control of the plating thickness for a plurality of designated areas or consecutive designated areas is achieved by the selective or cooperative use of a plurality of third electrodes. Similarly, the ninth embodiment can also be applied to the control of the plating height for the notch area of the wafer. The applicability of the electroplating apparatus can be increased when a plurality of third electrodes are used to control the plating height of the notch area of the wafer. For example, the same electroplating equipment can be applied to different products. Different products are arranged with different chips on the wafer, and the shape and size of the photoresist in the notch area of the wafer may vary greatly, and some even differ by a factor of two or three. If there is only one third electrode, it may not be well adapted to different products. If a plurality of third electrodes of different sizes and shapes are arranged, different third electrodes can be adapted to different products for better applicability.

The mode having the single third electrode described in the first to sixth embodiments described above can also be used for the control of the plating height of a designated area such as a peripheral area of the wafer.

Tenth Embodiment

Figure 10:
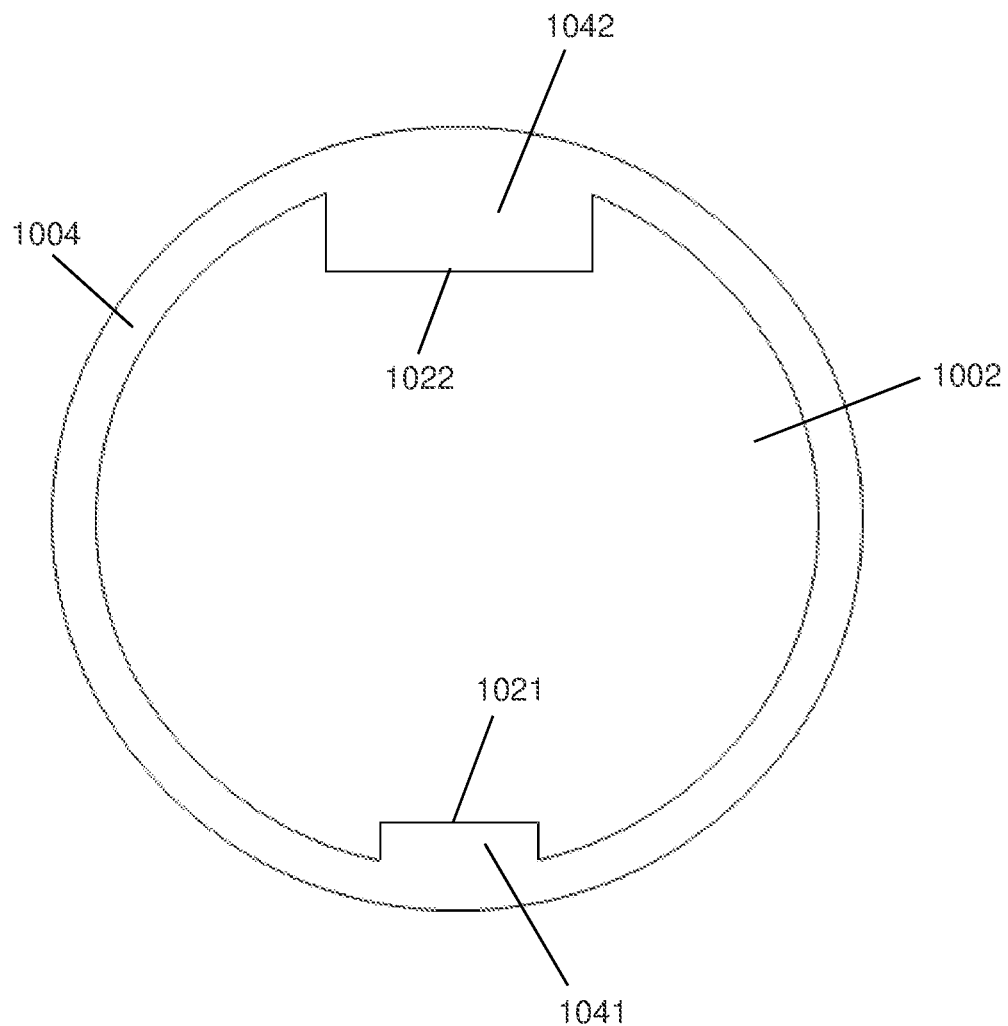
FIG. 10 illustrates a schematic structural view of electrodes of an electroplating apparatus according to a tenth embodiment of the present invention.

FIG. 10 illustrates a schematic structural view of electrodes of an electroplating apparatus according to a tenth embodiment of the present invention. The electroplating apparatus of the tenth embodiment is an evolution of a multi-electrode form based on the seventh embodiment.

The electroplating apparatus according to the tenth embodiment comprises two electrodes: a first electrode 1002 and a second electrode 1004. The first electrode 1002 is circular and covers a central area of the wafer. The first electrode is provided with concave portions 1021 and 1022. The first electrode is powered by a first power supply. The second electrode 1004 is a ring and covers a peripheral area of the wafer. The second electrode 1004 is provided with protruding portions 1041 and 1042. The second electrode is powered by a second power supply. The protruding portion 1041 of the second electrode 1004 is matched with the concave portion 1021 of the first electrode 1002, and the protruding portion 1041 is embedded into the concave portion 1021. The protruding portion 1042 of the second electrode 1004 is matched with the concave portion 1022 of the first electrode 1002, and the protruding portion 1042 is embedded into the concave portion 1022. The spliced first electrode 1002 and the second electrode 1004 collectively cover the entire area of the wafer. Dimensions of the first electrode and the second electrode can be determined according to actual requirements, as in the previous embodiment, and the description is not repeated here. The two concave portions and protruding portions have different sizes.

When there are a plurality of concave portions and protruding portions, the control manner of each of the concave portion and the protruding portion can be referred to the operation mode of the seventh embodiment described above. The description will not be repeated here.

An advantage of a configuration employing multiple concave portions and protruding portions is that control over the entire edge area of the wafer can be achieved. The control of the plating thickness for a plurality of designated areas or consecutive designated areas is achieved by the selective or cooperative use of a plurality of concave portions and protruding portions. Similarly, the tenth embodiment can also be applied to the control of the plating height for the notch area of the wafer. The applicability of the electroplating apparatus can be increased when a plurality of concave portions and protruding portions are used to control the plating height of the notch area of the wafer. For example, the same electroplating equipment can be applied to different products. Different products are arranged with different chips on the wafer, and the shape and size of the photoresist in the notch area of the wafer may vary greatly, and some even differ by a factor of two or three. If there is only one concave portion and protruding portion, it may not be well adapted to different products. If a plurality of concave portions and protruding portions of different sizes and shapes are arranged, different concave portions and protruding portions can be adapted to different products for better applicability.

The mode having the single concave portion and protruding portion described in the foregoing seventh and eighth embodiments can also be used for the control of the plating height of the designated areas such as the peripheral areas of the wafer.

The ninth and tenth embodiments can also be combined with the adjustment of the electric field and the control of the rotation speed of the wafer. The ninth and tenth embodiments can also be summarized as an electroplating method for electroplating on a surface of a wafer by using a plurality of electrodes, the method controlling the plurality of electrodes forming electric fields on the surface of the wafer. A plurality of independent electric fields are formed in a plurality of designated areas, and the intensity of the plurality of independent electric fields are separately controlled. The total amount of power received within the designated areas is adjusted so as to control a plating thickness at a specified location on the surface of the wafer.

The electroplating apparatus and the electroplating method of the present invention control the electroplating height of the notch of the wafer by directly controlling the intensity of the electric field. Compared with a conventional control method which only changing the rotation speed of the wafer, the present invention is more accurate and reliable, the electroplating efficiency is also increased.

The above embodiments are provided to those skilled in the art to realize or use the invention, under the condition that various modifications or changes being made by those skilled in the art without departing the spirit and principle of the invention, the above embodiments may be modified and changed variously, therefore the protection scope of the invention is not limited by the above embodiments, rather, it should conform to the maximum scope of the innovative features mentioned in the Claims.

What is claimed is:

1. An electroplating apparatus for electroplating on a front surface of a wafer, the electroplating apparatus comprising a plurality of anodes and a plurality of rectifiers or a plurality of power supplies, the plurality of anodes collectively covering a front surface of the wafer for forming electric fields on the front surface of the wafer, wherein an independent electric field is formed in a designated area, and an intensity of the independent electric field is independently controlled, the plurality of anodes is respectively controlled by the plurality of rectifiers or the plurality of power supplies, wherein at least one of the plurality of the rectifiers or at least one of the plurality of power supplies is configured to reduce a total amount of power received by a notch of the wafer while the notch is positioned within the designated area, wherein the plurality of anodes and their respective regions has separate liquid circulation conduits, and partitions are arranged between areas covered by the plurality of anodes, so that separate electric field spaces are formed.

2. The electroplating apparatus according to claim 1, wherein when the notch of the wafer is positioned within the designated area, the wafer rotates at a constant speed, and the intensity of the independent electric field is changed so that the total amount of power received by the notch within the designated area is reduced.

3. The electroplating apparatus according to claim 1, wherein when the notch of the wafer is positioned within the designated area, the intensity of the independent electric field is decreased and remains constant, and a rotation speed of the wafer is changed so that the total amount of power received by the notch within the designated area is reduced.

4. The electroplating apparatus according to claim 1, wherein when the notch of the wafer is positioned within the designated area, both the intensity of the independent electric field and a rotation speed of the wafer are changed so that the total amount of power received by the notch within the designated area is reduced.

5. The electroplating apparatus according to claim 1, further comprising a rotatable chuck, wherein the wafer is clamped on the chuck and rotates along with the chuck, and wherein a relative position of the notch of the wafer and the chuck is fixed.

6. The electroplating apparatus according to claim 5, wherein the chuck is provided with an anode.

7. The electroplating apparatus according to claim 1, wherein the plurality of anodes comprises three anodes:

a first anode, the first anode being circular and covering a central area of the wafer, the first anode being connected to a first rectifier of the plurality of rectifiers;

a second anode, the second anode being a ring with a notch and covering a peripheral area of the wafer, the second anode being connected to a second rectifier of the plurality of rectifiers; and a third anode, disposed at a position of the notch of the second anode, the third anode being connected to a third rectifier of the plurality of rectifiers.

8. The electroplating apparatus according to claim 7, wherein when the notch of the wafer is not positioned within a coverage area of the third anode, the third rectifier operates in a constant current mode and outputs a constant third current;

with a rotation of the wafer, when the notch of the wafer enters into the coverage area of the third anode, the output current of the third rectifier is gradually decreased from the third current to a notch plating current; and when the notch of the wafer leaves the coverage area of the third anode along with the rotation of the wafer, the output current of the third rectifier is gradually increased from the notch plating current to the third current.

9. The electroplating apparatus according to claim 8, wherein when a reference point of the notch of the wafer is aligned with a reference point of the third anode, the third rectifier outputs the notch plating current; or when the reference point of the notch of the wafer is within a reference region of the third anode, the third rectifier continuously outputs the notch plating current.

10. The electroplating apparatus according to claim 7, wherein when the notch of the wafer is not positioned within a coverage area of the third anode, the third rectifier operates in a constant current mode and outputs a constant third current;

with a rotation of the wafer, when the notch of the wafer enters into the coverage area of the third anode, the third rectifier switches to a constant voltage mode, the output voltage of the third rectifier is gradually decreased from a third voltage to a notch plating voltage; and when the notch of the wafer leaves the coverage area of the third anode along with the rotation of the wafer, the output voltage of the third rectifier is gradually increased from the notch plating voltage to the third voltage.

11. The electroplating apparatus according to claim 7, wherein the third rectifier operates in a DC pulse mode;

when the notch of the wafer is not positioned within a coverage area of the third anode, a duty cycle of an output current of the third rectifier is a high duty cycle;

with a rotation of the wafer, when the notch of the wafer enters into the coverage area of the third anode, the duty cycle of the output current of the third rectifier is gradually decreased from the high duty cycle to a low duty cycle; and when the notch of the wafer leaves the coverage area of the third anode along with the rotation of the wafer, the duty cycle of the output current of the third rectifier is gradually increased from the low duty cycle to the high duty cycle.

12. The electroplating apparatus according to claim 1, wherein the plurality of anodes comprises three anodes:
- a first anode, the first anode being circular and covering a central area of the wafer, the first anode being powered by a first power supply of the plurality of power supplies;
- a second anode, the second anode being a ring with a notch and covering a peripheral area of the wafer, the second anode being powered by a second power supply of the plurality of power supplies;
- a third anode, the third anode being curved and disposed at a position of the notch of the second anode, the third anode being powered by a third power supply of the plurality of power supplies;
- wherein the third anode is matched with the second anode, the third anode and the second anode are spliced to form a complete ring, and the third anode is insulated from the second anode;
- wherein the first anode, the second anode and the third anode collectively cover the entire area of the wafer.

13. The electroplating apparatus according to claim 12, wherein
- when the notch of the wafer is not positioned within the coverage area of the third anode, the current density of the third anode is consistent with the current density of the second anode;
- with the rotation of the wafer, when the notch of the wafer enters into the coverage area of the third anode, the current density of the third anode is gradually decreased;
- when the notch of the wafer leaves the coverage area of the third anode along with the rotation of the wafer, the current density of the third anode is gradually increased to be consistent with the current density of the second anode.

14. The electroplating apparatus according to claim 1, wherein the plurality of anodes comprises three anodes:
- a first anode, the first anode being circular and covering a central area of the wafer, the first anode being connected to a first rectifier of the plurality of rectifiers;
- a second anode, the second anode being a ring with a notch and covering a peripheral area of the wafer, the second anode being connected to a second rectifier of the plurality of rectifiers;
- a third anode, disposed at a position of the notch of the second anode, the third anode being connected to a switch, the switch being connected to the second anode and a control power supply, the switch being switched so that the third anode being connected to the second anode or the control power supply;
- wherein the first anode, the second anode and the third anode collectively cover the entire area of the wafer.

15. The electroplating apparatus according to claim 14, wherein
- when the notch of the wafer is not positioned within the coverage area of the third anode, the switch makes the third anode be connected to the second anode, and both be connected to the second rectifier;
- with the rotation of the wafer, when the notch of the wafer enters into the coverage area of the third anode, the switch makes the third anode be connected to the control power supply, and the control power supply adjusts the duty cycle of the output current;
- when the notch of the wafer leaves the coverage area of the third anode along with the rotation of the wafer, the switch makes the third anode be connected to the second anode.

16. The electroplating apparatus according to claim 1, wherein the plurality of anodes comprises two anodes:
- a first anode, the first anode being circular and covering a central area of the wafer, the first anode being provided with a concave portion and powered by a first power supply of the plurality of power supplies;
- a second anode, the second anode being a ring and covering a peripheral area of the wafer, the second anode being provided with a protruding portion and powered by a second power supply of the plurality of power supplies;
- wherein the protruding portion of the second anode is matched with the concave portion of the first anode, the protruding portion is embedded into the concave portion, and the spliced first anode and the second anode collectively cover the entire area of the wafer.

17. The electroplating apparatus according to claim 16, wherein
- when the notch of the wafer is not positioned within the coverage area of the protruding portion, the current density of the second anode is maintained constant;
- with the rotation of the wafer, when the notch of the wafer enters into the coverage area of the protruding portion, the current density of the second anode is gradually decreased;
- when the notch of the wafer leaves the coverage area of the protruding portion along with the rotation of the wafer, the current density of the second anode is gradually increased.

18. The electroplating apparatus according to claim 1, wherein the plurality of anodes comprises two anodes:
- a first anode, the first anode being circular and the diameter of the first anode covering the diameter of the wafer, the first anode being provided with a notch portion and powered by a first power supply of the plurality of power supplies;
- a second anode, disposed at the position of the notch portion of the first anode, the second anode being powered by a second power supply of the plurality of power supplies;
- wherein the first anode and the second anode collectively cover the entire area of the wafer.

19. The electroplating apparatus according to claim 18, wherein
- when the notch of the wafer is not positioned within the coverage area of the second anode, the current density of the second anode is consistent with the current density of the first anode;
- with the rotation of the wafer, when the notch of the wafer enters into the coverage area of the second anode, the current density of the second anode is gradually decreased;
- when the notch of the wafer leaves the coverage area of the second anode along with the rotation of the wafer, the current density of the second anode is gradually increased to be consistent with the current density of the first anode.

20. The electroplating apparatus according to claim 1, wherein a plurality of independent electric fields is formed in a plurality of designated areas, and one or more independent electric fields are selected according to the notch of the wafer.

* * * * *